United States Patent
Ravi et al.

(10) Patent No.: US 8,519,763 B2
(45) Date of Patent: Aug. 27, 2013

(54) INTEGRATED CIRCUITS WITH DUAL-EDGE CLOCKING

(75) Inventors: Ajay K. Ravi, San Jose, CA (US); David Lewis, Toronto (CA)

(73) Assignee: Altera Corporation, San Jose, CA (US)

( * ) Notice: Subject to any disclaimer, the term of this patent is extended or adjusted under 35 U.S.C. 154(b) by 266 days.

(21) Appl. No.: 12/814,344

(22) Filed: Jun. 11, 2010

(65) Prior Publication Data

US 2011/0304371 A1    Dec. 15, 2011

(51) Int. Cl.
*H03K 3/017* (2006.01)
(52) U.S. Cl.
USPC .......................................... 327/175; 327/291
(58) Field of Classification Search
None
See application file for complete search history.

(56) References Cited

U.S. PATENT DOCUMENTS

| | | | |
|---|---|---|---|
| 4,771,279 A | 9/1988 | Hannah | |
| 6,301,322 B1 | 10/2001 | Manning | |
| 6,813,674 B1 | 11/2004 | Velasco et al. | |
| 6,873,187 B1 | 3/2005 | Andrews et al. | |
| 6,930,552 B2 | 8/2005 | Miyagi | |
| 7,583,103 B2 | 9/2009 | Lewis et al. | |
| 7,948,287 B2 * | 5/2011 | Oh et al. | 327/158 |
| 7,999,589 B2 * | 8/2011 | Lin | 327/175 |
| 2004/0203479 A1 | 10/2004 | Lin | |
| 2005/0122153 A1* | 6/2005 | Lin | 327/291 |
| 2007/0252631 A1 | 11/2007 | Kaviani et al. | |
| 2007/0290730 A1* | 12/2007 | Dai et al. | 327/175 |
| 2009/0146715 A1* | 6/2009 | Jiang | 327/175 |

FOREIGN PATENT DOCUMENTS

EP    0366326    5/1990

* cited by examiner

*Primary Examiner* — Cassandra Cox
(74) *Attorney, Agent, or Firm* — Treyz Law Group; Jason Tsai (57) ABSTRACT

Integrated circuits that support dual-edge clocking are provided. Integrated circuits may include phase-locked loops that generate square-wave clock signals. The clock signals may be provided from off-chip equipment through input-output pins. The clock signals may be routed through a clock distribution network to provide local clock signals to pulse generators that generate clock pulses on rising and falling clock edges. The pulse generators may generate clock pulses that are triggered by the rising and falling clock edges with a common pulse width for optimum performance. Duty cycle distortion introduced by the clock network may be minimized for optimum performance. Adaptive duty cycle distortion circuitry may be used to control the pull-up/pull-down drive strengths of the clock buffer so that the high clock phase of the local clock signals is approximately a half clock cycle.

21 Claims, 11 Drawing Sheets

| CLK_CTRL | ERRH | ERRL |
|---|---|---|
| 11 | 1 | 0 |
| 12 | 1 | 0 |
| 13 | 1 | 0 |
| 14 | 1 | 0 |
| 15 | 1 | 0 |
| 16 | 0 | 0 |
| 17 | 0 | 0 |
| 18 | 0 | 0 |
| 19 | 0 | 0 |
| 20 | 0 | 0 |
| 21 | 0 | 0 |
| 22 | 0 | 0 |
| 23 | 0 | 1 |
| 24 | 0 | 1 |
| 25 | 0 | 1 |

INTEGRATED CIRCUITS WITH DUAL-EDGE CLOCKING

BACKGROUND

This relates generally to integrated circuits, and more particularly, to integrated circuits with pulse latches.

Pulse latches are level-sensitive latches that are controlled by clock pulse signals (i.e., level-sensitive latches are enabled during certain phases of clock pulse signals). Clock pulse signals are typically generated from square wave clock signals (i.e., clock signals having a 50% duty cycle) using pulse generators. These clock pulse signals have clock pulses that are triggered by rising clock edges of the square wave clock signals.

Pulse latches can be used to implement time borrowing schemes in integrated circuits. Time borrowing schemes may allow circuit performance to be improved by optimizing timing performance along critical circuit paths.

As circuit density and clock rates increase with improvements in process technology, the amount of dynamic power consumed increases. The clocking circuitry is a substantial contributor to this power consumption. It would therefore be desirable to be able to provide pulse latch circuitry with enhanced power efficiency.

SUMMARY

Integrated circuits that support dual-edge clocking schemes may include phase-locked loops (PLLs) that generate square-wave clock signals at their outputs. If desired, the square-wave clock signals may be received through input-output pins from external equipment. A given clock buffer may receive the clock signals from an associated PLL or from the input-output pins and may drive the clock signals onto a clock distribution network.

The clock distribution network may route the original clock signals to different regions on an integrated circuit. A local logic block in one of the multiple logic regions may receive a local (row) clock signal. The local clock signal is a potentially distorted version of the original clock signal supplied from the PLL or an input-output pin. The local clock signal may be fed to a pulse generator that is used to control a pulse latch.

The pulse generator may use the local clock signal to trigger clock pulses at the both the rising and falling clock edges to support a dual-edge clocking scheme. Pulse generators that provide positive-edge-triggered clock pulses (e.g., clock pulses triggered by the rising clock edge) and negative-edge-triggered clock pulses (e.g., clock pulses triggered by the falling clock edge) with approximately equal pulse widths may be provided to ensure optimum performance.

Such pulse generators may include symmetrical logic gates and transmission gates that are designed to match the various delays of the logic gates in the pulse generators so that the pulse widths of both positive-edge-triggered and negative-edge-triggered clock pulses are well balanced.

Duty cycle distortion may also be minimized (e.g., to ensure than the duty cycle of the local clock signals is close to 50%) in the clock network to optimize performance. In one suitable embodiment, an adaptive duty cycle distortion (DCD) correction circuit may be used to adjust the pull-up and pull-down drive strengths of the clock buffer.

Adaptive DCD correction circuitry may include a high clock phase register transfer circuit and a low clock phase register transfer circuit each having a delay circuit that generates a given delay. The high clock phase register transfer circuit may produce a high error signal whenever the high clock phase is less than the given delay and a low error signal whenever the high clock phase is greater than the given delay. The low clock phase register transfer circuit may produce a high error signal if the low clock phase is less than the given delay and a low error signal if the low clock phase is greater than the given delay.

The error signals may be fed to control circuitry within the DCD correction circuitry. The control circuitry may be used to determine an optimum control setting to configure the clock buffer (e.g., an optimum control setting to adjust the pull-down/pull-up drive strength of the clock buffer) in order to provide the local clock signals with approximately 50% duty cycle.

If desired, adaptive DCD correction circuitry may be connected to the output of the PLL. The DCD correction circuitry may include a delay circuit that provides a given delay. The delay circuit receives the original clock signal generated by the PLL and provides a delayed clock signal at its output. The delayed clock signal may exhibit approximately 50% duty cycle, because it is located in close proximity to the PLL and therefore has not been exposed to substantial sources of distortion.

The DCD correction circuitry may include a first delay-locked loop that adaptively adjusts the given delay so that the rising clock edge of the local clock signal is aligned to the rising clock edge of the delayed clock signal. The correction circuitry may also include a second delay-locked loop that adaptively adjusts the pull-down drive strength of the clock buffer so that the falling edge of the local clock signal is aligned to the falling clock edge of the delayed clock signal.

Adjusting the given delay and the clock buffer using the correction circuitry formed using this arrangement fixes the high clock phase of the local clock signal to the high clock phase of the delayed clock signal. Fixing the high clock phases in this way minimizes duty cycle distortion, because the high clock phase of the delayed clock signal is approximately equal to a half clock cycle.

Further features of the present invention, its nature and various advantages will be more apparent from the accompanying drawings and the following detailed description.

DETAILED DESCRIPTION

This relates to integrated circuits that include logic circuitry. The logic circuitry may be part of an integrated circuit such as a digital signal processor, a microprocessor, an application-specific integrated circuit, a programmable integrated circuit such as a programmable logic device, etc.

Figure 1:
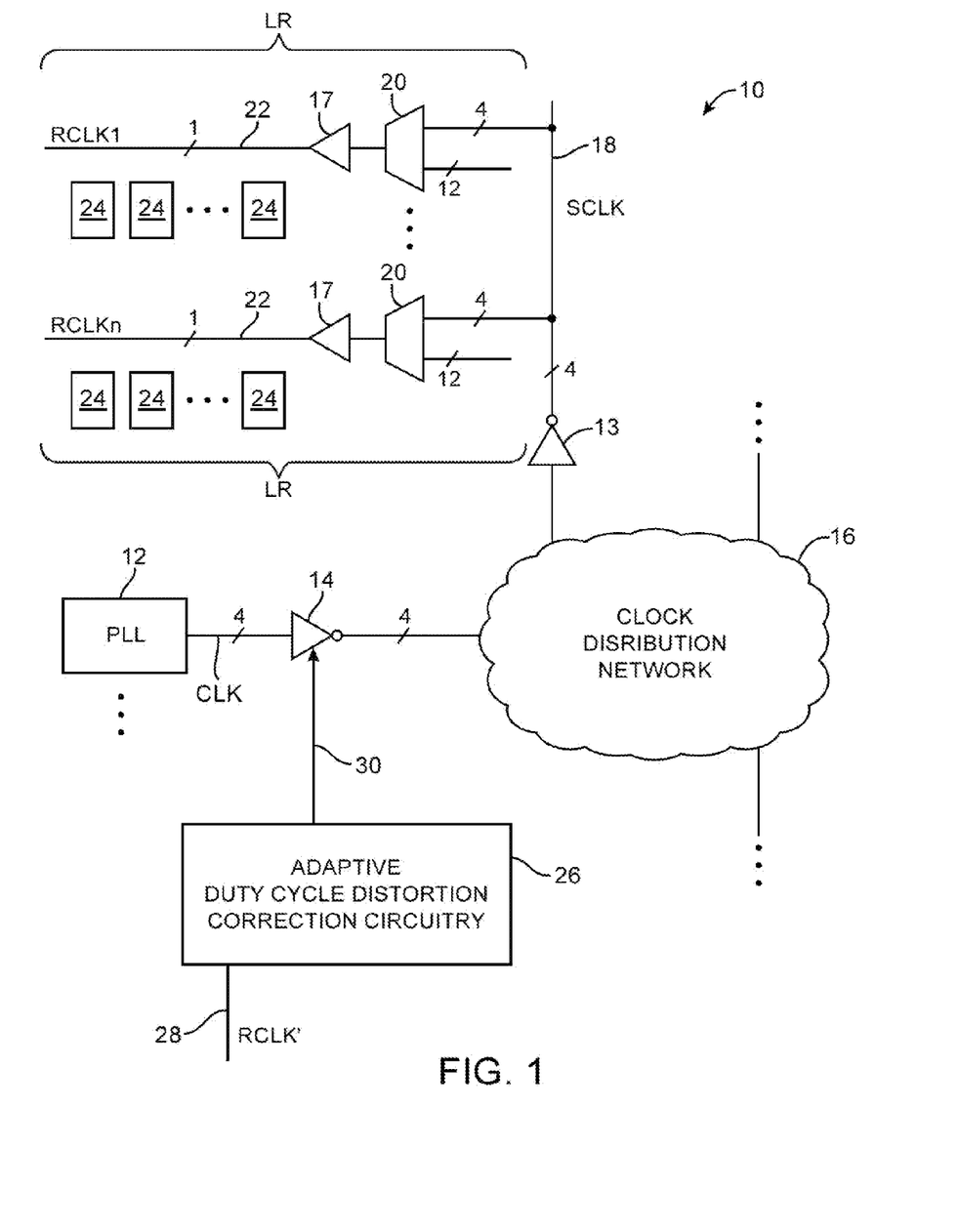
FIG. 1 is a diagram showing how a clock distribution network distributes clock signals in accordance with an embodiment of the present invention.

An illustrative integrated circuit 10 that includes logic circuitry is shown in FIG. 1. The logic circuitry of device 10 may include pulse latch circuitry that supports dual-edge clocking (e.g., a clocking scheme in which pulse latches are enabled for a brief time period after each rising/falling clock edge). The dual-edge clocking scheme can provide significant power savings compared to conventional single-ended clock schemes.

For example, conventional clocking schemes may have a clock signal of frequency f that is distributed to the pulse latches operating at a desired performance level. In contrast, a clock signal of frequency f/2 may be distributed to the pulse latches to obtain the same performance level using the dual-edge clocking approach, thereby consuming significantly less power (e.g., approximately 50% less power).

Integrated circuit 10 may include a phase-locked loop (PLL) such as PLL 12 that generates a clock signal CLK (e.g., an original square-wave clock signal with 50% duty cycle) at its output. Clock CLK may be distributed to different regions on device 10. More than one phase-locked loop 12 may be formed on integrated circuit 10. Clock signal CLK may also be provided by off-chip sources through input-output pins, if desired.

For example, phase-locked loop 12 may feed clock signal CLK to a clock buffer 14 that drives clock signal CLK onto a clock distribution network 16. A single PLL may generate more than one CLK signal, typically with related frequencies and phases. There may be one or more than one PLL on integrated circuit 10. Network 16 may include conductive lines and buffers. Clock buffer 14 may be an inverting stage and may sometimes be referred to as a clock driver. Clock buffer 14 may include one or more than one stages of logic circuits. Clock signal CLK may include four distinct clock signals each having a respective clock rate and clock phase (as an example). In general, phase-locked loop 12 may generate any desired number of distinct square-wave clock signals at its output.

Clock distribution network 16 receives signal CLK from clock buffer 14 and distributes clock signal CLK to different logic regions on integrated circuit 10. Network 16 may be arranged in a tree configuration (sometimes referred to as a clock tree). Network 16 may, for example, be an H-tree clock network. Use of an H-tree ensures that delays to different points in the logic circuitry are well matched. If desired, configurable multiplexers may be included in programmable logic devices whereas non-programmable devices may have fewer or no multiplexers.

Clock distribution network 16 may feed the clock signals (e.g., the distinct clock signals generated by one or more PLL 12) to different branches in the clock tree via multiple layers of buffering. Each branch in the clock tree may be associated with a respective logic region LR in the logic circuitry. The clock signals that are received by each logic region from network 16 may be referred to as spine (regional) clock signals SCLK. As shown in FIG. 1, signals SCLK may be provided over a signal path such as branch 18. Spine clock signals SCLK may be driven by buffers such as buffer (inverter) 13. Multiple levels of buffering may be used to distribute signals SCLK throughout device 10.

Signals SCLK may be fed to each multiplexer 20 in a logic region. Each multiplexer 20 may also receive spine clock signals from other branches. As shown in FIG. 1, multiplexer 20 may have 16 inputs that receive 16 spine clock signals from four different branches 18. If desired, multiplexer 20 may have any number of inputs and may receive regional clock signals from any number of branches.

Each multiplexer 20 may have an output that is connected to a clock buffer 17 that drives a row clock signal on row clock line 22. Each multiplexer 20 may be configured to pass a desired one of the spine clock signals at one of its inputs to line 22. For example, there may be n row clock signals (e.g., RCLK1, . . . , RCLKn) provided over n row clock lines 22, as shown in FIG. 1.

If desired, the logic of device 10 may be arranged in blocks of logic sometimes referred to as logic array blocks (LABs). Rows of such blocks 24 (e.g., LABs) may be formed in each logic region. Blocks 24 in each row of logic circuitry may receive row clock signals from multiple lines 22. For example, a given logic array block 24 or other suitable block of circuitry may receive row clock signals (e.g., row clock signals RCLK1-RCLK6) from six different row clock lines 22.

In the case of dual edged clocking, it is desirable for a given row (local) clock signal RCLK' to have 50% duty cycle (i.e., row clock signals should not exhibit duty cycle distortion). Signal RCLK' may serve to represent a local row clock signal of interest that is selected from any one of the row clock signals. Local clock signal RCLK' may experience duty cycle distortion (DCD) as the original clock signals are distributed through network 16, because of the presence of noise and other sources of random variations. Local signal RCLK' might not be one of the configurable clock signals generated for use in the programmable logic, but might be a distinct replica of such a signal in order to provide a dedicated signal path that is fed back to the PLL, without using any user clock signals.

Control circuitry such as adaptive duty cycle distortion (DCD) correction circuitry 26 may receive RCLK' over line 28 and may be used to dynamically adjust clock buffer 14 (i.e., the clock buffer that is connected to the output of PLL 12) in real time to ensure that signal RCLK' experiences minimal duty cycle distortion.

Duty cycle distortion is preferably minimized in integrated circuits that use the dual-edge clocking architecture. In order to provide matching of duty cycle at the logic to the duty cycle of the clock signal generated at the PLL, it is desirable for the delay of the rising edge of the clock from the PLL to RCLK' to be the same as the delay of the falling clock edge from the PLL to RCLK'. In the case of dual edge clocked circuits the PLL will generate a 50% duty cycle so that both phases are equal.

Figure 2:
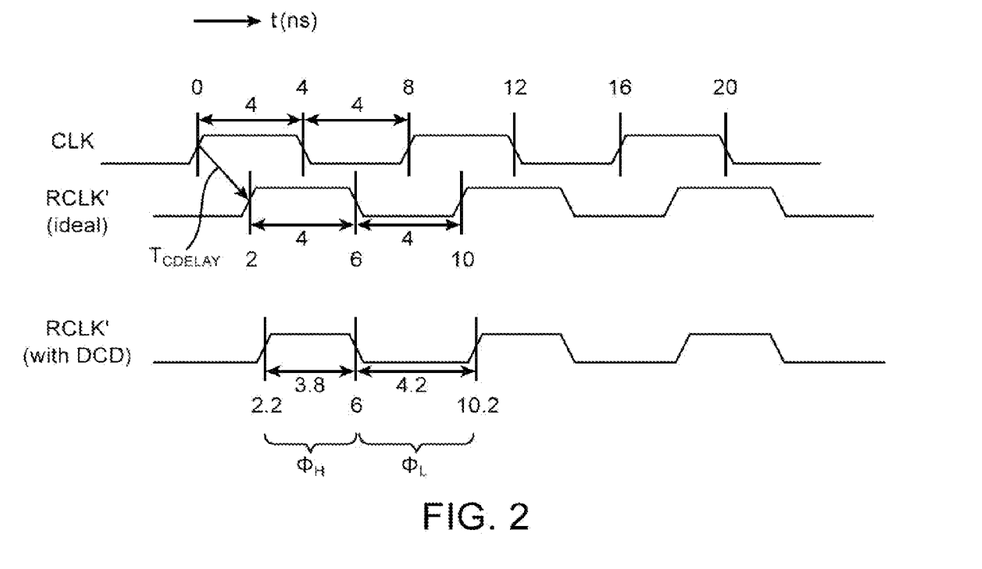
FIG. 2 is a timing diagram showing potential duty cycle distortion during operation of logic circuitry in accordance with an embodiment of the present invention.

For example, consider a first scenario in which duty cycle distortion causes clock rise time to be slower than fall time, as shown in FIG. 2. FIG. 2 shows original clock signal CLK (e.g., a clock signal generated by PLL 12 of FIG. 1) with a period of eight nanoseconds (ns). Signal CLK is a square-wave clock signal with 50% duty cycle.

Ideally, the signal RCLK' that is received at a given row clock line would exhibit a 50% duty cycle and may, for example, experience a clock network delay $T_{CDELAY}$ of 2 ns (see, e.g., FIG. 2).

In reality, duty cycle distortion may cause a rise time delay of an additional 0.2 ns, as shown in FIG. 2, so that the rising edge delay is 2.2 ns but the falling edge delay remains at 6 ns. This mismatch in rise/fall time may result in a high clock phase $\Phi_H$ with duration of 3.8 ns and a low lock phase $\Phi_L$ with a duration of 4.2 ns. This may not be acceptable if design criteria require clock phases with at least 4 ns durations for proper operation.

Figure 3:
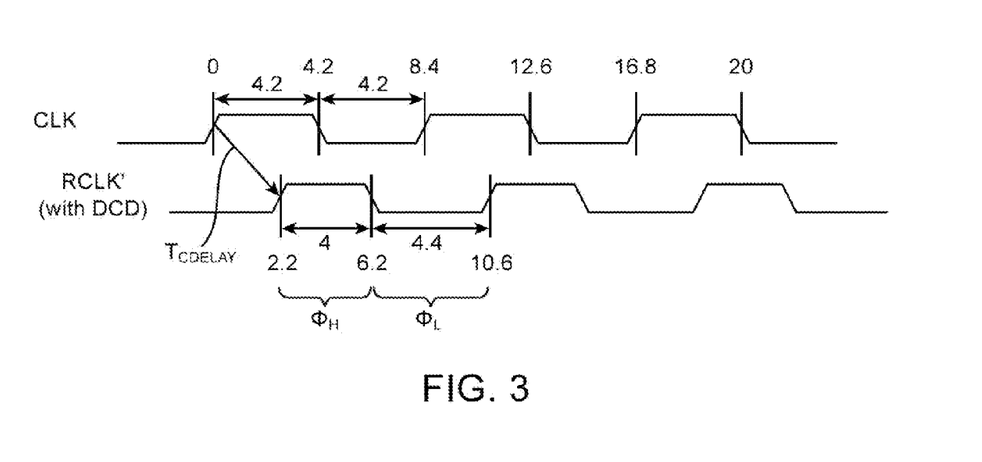
FIG. 3 is a timing diagram showing one possible way of compensating for duty cycle distortion in accordance with an embodiment of the present invention.

One suitable approach for compensating for duty cycle distortion is to lengthen the period of original signal CLK. As shown in FIG. 3, increasing the clock period to 8.4 ns would result in high clock phase $\Phi_H$ with a duration of 4 ns and low clock phase $\Phi_L$ with a duration of 4.4 ns. Satisfying design criteria in this way degrades the performance of the logic circuitry, because the frequency of the original clock signals needs to be lowered.

FIGS. 2 and 3 illustrate potential duty cycle distortion that may arise as signals are distributed using clock network 16. Duty cycle distortion may also affect performance at a local level. For example, signal RCLK' may be fed to pulse generators in each logic block 24 (FIG. 1). The pulse generators may be used to generate clock pulse signals based on received signal RCLK'. It is desirable for the clock pulses triggered by the rising clock edges and falling clock edges to have equal pulse widths for optimum performance.

Figure 4:
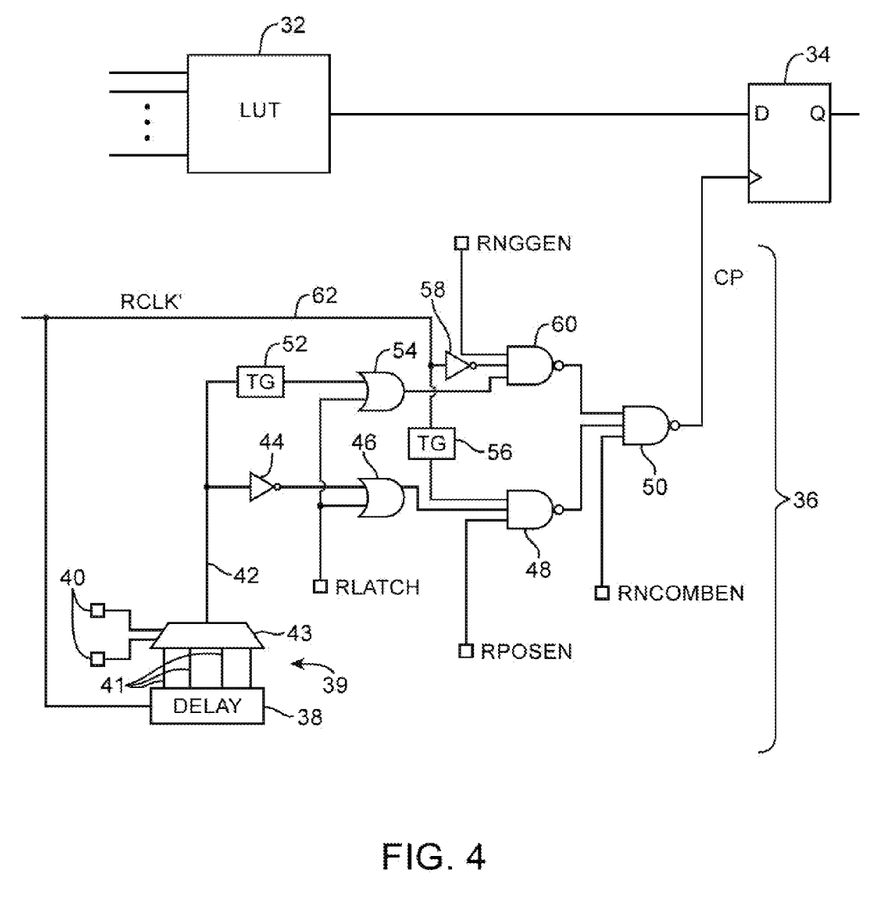
FIG. 4 is a circuit diagram of an illustrative dual-edge pulse generator in accordance with an embodiment of the present invention.

FIG. 4 is a circuit diagram of an illustrative configurable dual-edge pulse generator 36 that balances signal delays to obtain matched pulse widths for both rising and falling edges. Dual-edge pulse generator 36 may include a configurable delay circuit 39. A given row clock signal RCLK' that is provided on clock input line 62 is distributed to delay element 38. Delay element 38 produces four different delays (in this illustrative example). Signal RCLK' is therefore delayed by one of four corresponding amounts at the outputs 41 of delay element 38.

Multiplexer 43, which is adjusted by the states of programmable elements 40 (e.g., configuration random-access memory loaded with configuration bits), provides a selected one of the delayed versions of signal RCLK' on line 42 at its output.

Logic OR gate 46 has a first input that receives a delayed clock signal (e.g., a delayed version of RCLK') through inverter 44 and has a second input hat receives control signal RLATCH. Control signal RLATCH may be set to logic "0" to enable pulse generator 36 or to logic "1" to disable pulse generator 36. Gate 46 may have an output that is connected to a first input of logic NAND gate 48. Gate 48 may have a second input that receives signal RCLK' through transmission gate 56 and a third input that receives control signal RPOSEN. Transmission gate 56 is intended to match as closely as practical to the delay of inverter 58. Control signal RPOSEN may be set to "1" to enable pulse generator 36 to be triggered by the rising clock edges of signal RCLK'. Clock pulses that are triggered in this way may sometimes be referred to as positive-edge-triggered clock pulses. Control signal RPOSEN may be set to "0" to prevent clock pulse triggering at the rising clock edges of RCLK'.

Gate 48 receives signal RCLK' through circuit 56 and the delayed clock signal from gate 46 and provides a corresponding inverted pulse signal to a first input of logic NAND gate 50. Gate 50 produces a clock pulse CP with an adjustable pulse width corresponding to the rising clock edges of RCLK' at its output. The pulse width of clock pulse CP is determined by the amount of delay selected by multiplexer 43.

Logic OR gate 54 may have a first input that receives the delayed clock signal through transmission gate 52 and a second input that receives control signal RLATCH. Transmission gate 52 is intended to match the delay of inverter 44 as closely as practical. Gate 54 may have an output connected to a first input of LOGIC NAND gate 60. Gate 60 may have a second input that receives an inverted version of signal RCLK' through inverter 58 and a third input that receives control signal RNEGEN. Control signal RNEGEN may be set to "1" to enable pulse generator 36 to be triggered by the falling clock edges of signal RCLK'. Clock pulses that are triggered by the falling clock edges may sometimes be referred to as negative-edge-triggered clock pulses. Control signal RNEGEN may be set to "0" to prevent clock pulse triggering at the falling clock edges of RCLK'.

Gate 60 may receive the delayed clock signal from gate 54 and an inverted version of the clock signal through inverter 58 and may provide corresponding inverted clock pulse signal to a second input of NAND gate 50. Gate 50 may produce additional clock pulses corresponding to the falling edges of signal RCLK'.

The inputs of gates 48 and 60 are ordered in a consistent manner, with the enable signals RPOSEN and RNEGEN, the signal RCLK' or its inversion, and the delayed RCLK' or its inversion, connected in the same order from bottom to top of the NMOS gate stack in the NAND gates, ensuring nearly identical delays from inputs to the outputs. Together with the matching of delays of transmission gate 52 and inverter 44, and the matching of delays of transmission gate 56 with inverter 58, propagation delays and pulse widths from the rising and falling edges of RCLK' to respective pulses on the outputs of gates 60 and 48 are closely matched.

Gate 50 may have a third input that receives control signal RNCOMBEN. Control signal RNCOMBEN may be set to "1" to enable pulse generator 36 or may be set to "0" to disable pulse generator 36.

Control signals RPOSEN and RNEGEN may both be set to logic "1" to enable dual-edge clocking. Configuring pulse generator 36 to provide dual-edge clocking generates clock pulses on both rising and falling clock edges. Transmission gates 56 and 52 in pulse generator 36 ensure equal delays between the inverted and non-inverted versions of RCLK' and delayed RCLK'. Balancing delays using this approach helps match the widths of the positive-edge-triggered clock pulses and the negative-edge-triggered clock pulses.

Clock pulse CP is provided to a clock input of latches such as level-sensitive pulse latch 34. Pulse latch 34 may receive data from combinatorial logic circuitry such as a look-up table (LUT) circuit 32. If desired, latch 34 may receive data from register circuitry, input-output circuitry, programmable circuitry, etc.

Figure 5:
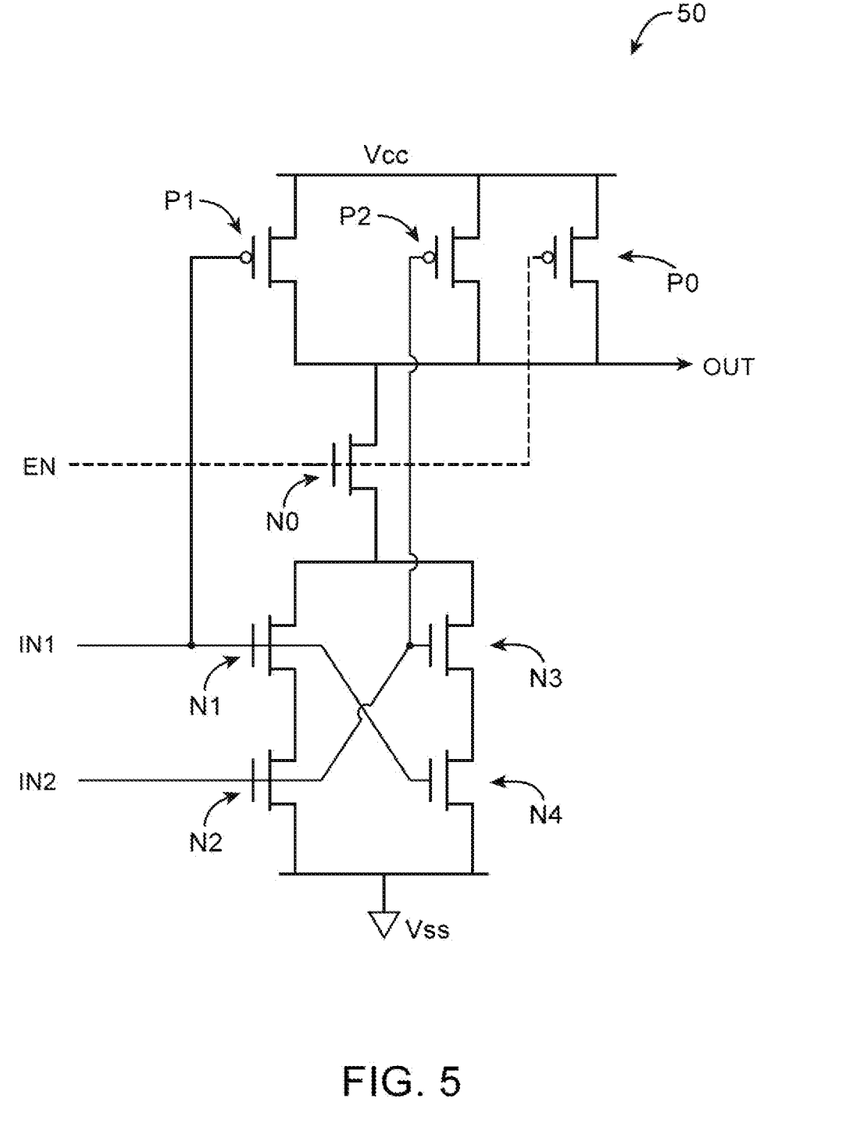
FIG. 5 is a circuit diagram of an illustrative three-input logic NAND gate that may be used in the dual-edge pulse generator of FIG. 4 in accordance with an embodiment of the present invention.

As shown in FIG. 5, NAND gate 50 may be implemented using a symmetrical structure to help match the pulse widths of the positive-edge-triggered clock pulses and the negative-edge-triggered clock pulses. Gate 50 may have a pull-up network that includes p-channel transistors such as transistors P1, P2, and P0 connected in parallel between a positive power supply line that is driven to power supply voltage Vcc and output OUT of gate 50. Transistors P1, P2, and P0 may have gates that are connected to the first, second, and third inputs of gate 50 (e.g., the first, second, and third inputs receive signals IN1, IN2, and EN, respectively).

Gate 50 may have a pull-down network that includes n-channel transistor N0 connected in series with first and second transistor pairs that are connected in parallel. The pull-down network may be coupled between output OUT and a ground power supply line (ground line) at ground voltage Vss (e.g., zero volts). The first transistor pair may include n-channel transistors N1 and N2 connected in series while the second transistor pair may include n-channel transistors N3 and N4 connected in series. Transistors N2 and N4 may each have a source terminal that is connected to the ground line.

Transistors N1 and N4 may have gates that are controlled by first input signal IN1. Transistors N2 and N3 may have gates that are controlled by second input signal IN2. Input lines carrying signals IN1 and IN2 that are routed in this way may be referred to as having a symmetrical (crisscrossed) routing configuration. Transistor N0 may have a gate that is controlled by enable signal EN.

The pull-up network of gate 50 is inherently symmetrical with respect to changes in signals IN1 and IN2, because transistors P1 and P2 are connected in parallel. The pull-down network of gate 50, which has the crisscrossed configuration, equalizes the propagation time for changes in signals IN1 and IN2. Because the first and second inputs of gate 50 receive inverted clock pulses from gates 48 and 60 (FIG. 4), forming gate 50 in this way may generate positive-edge-triggered clock pulses and the negative-edge-triggered clock pulses having substantially equal pulse widths.

Figure 6:
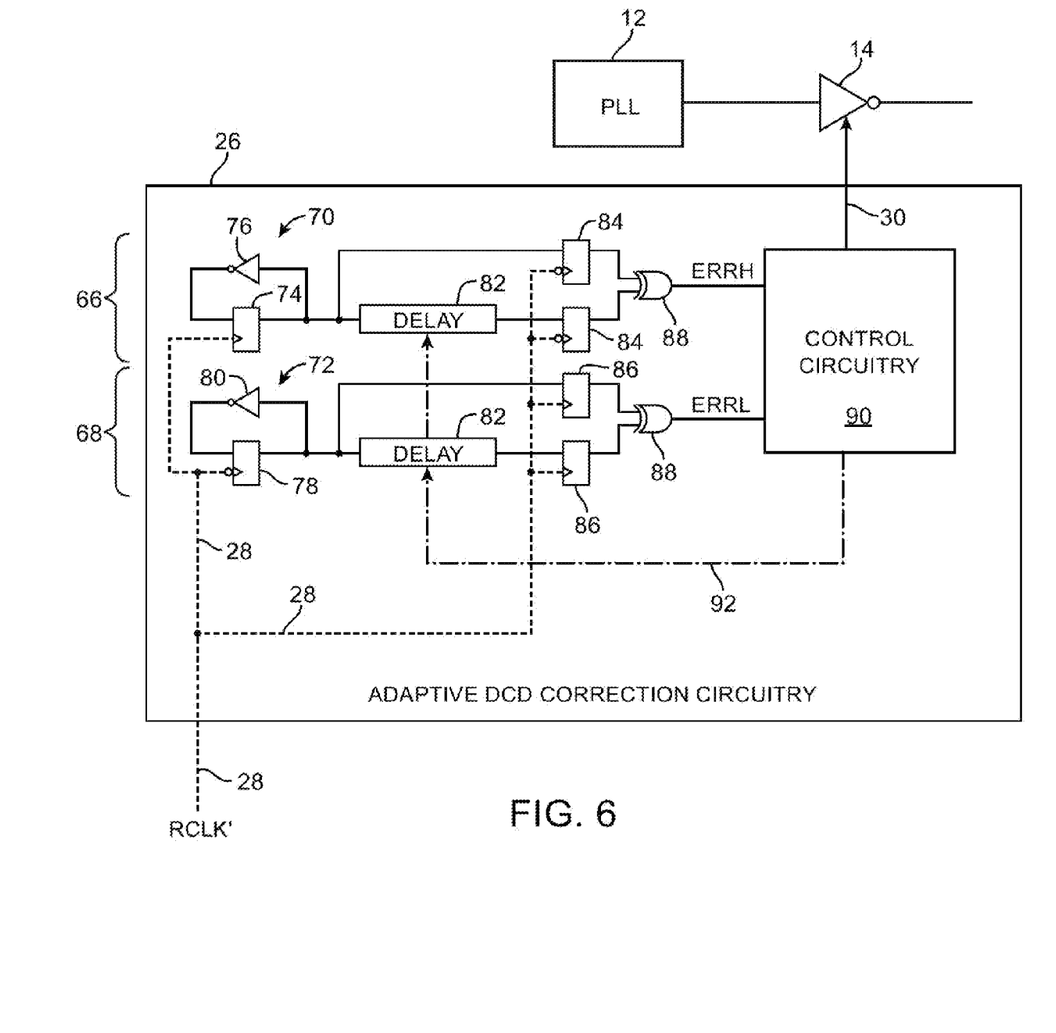
FIG. 6 is a diagram of illustrative adaptive duty cycle distortion correction circuitry in accordance with an embodiment of the present invention.

In additional to the design of the pulse generator to minimize local duty cycle distortion, it is also desirable to minimize duty cycle distortion in the clock network. Adaptive duty cycle distortion correction circuitry 26 may be used to adjust the pull-up and pull-down drive strengths of clock buffer (driver) 14 so that signal RCLK' experiences minimal duty cycle distortion, as shown in FIG. 6. DCD correction circuitry 26 may receive signal RCLK' over line 28. If RCLK' has a duty cycle that is greater than 50% (e.g., the high clock phase is relatively longer than the low clock phase), circuitry 26 will adjust clock buffer 14 to slightly shorten its high clock phase relative to its low clock phase so that the duty cycle of RCLK' is closer to 50%. If RCLK' has a duty that that is less than 50% (e.g., the high clock phase is relatively shorter than the low clock phase), circuitry 26 will adjust clock buffer 14 to slightly lengthen its high clock phase relative to its low clock phase so that the duty cycle of RCLK' is closer to 50%.

DCD correction circuitry 26 may include a first register transfer circuit such as high clock phase register transfer circuit 66, a second register transfer circuit such as low clock phase register transfer circuit 68, and control circuitry 90. Clock buffer 14 may be considered to form part of control circuitry 90. Clock buffer 14 is shown as a single inverter but may comprise multiple stages. Register transfer circuits 66 and 68 may each include a delay circuit 82. Delay circuits 82 may provide a delay that is approximately equal to a half clock cycle.

High clock phase register transfer circuit 66 may generate error signal ERRH at its output. Signal ERRH is low if the high clock phase (i.e., the duration of the high clock phase) is greater than the delay of delay circuit 82. Signal ERRH is high if the high clock phase is shorter than the delay of delay circuit 82.

Circuit 66 may include test data generation circuit 70. Test data generation may include flip-flop 74 and inverter 76. Flip-flop 74 may have an output that is fed back to its input through inverter 76. Test data generation circuit 70 may use this feedback configuration to generate a test data stream that toggles back and forth between logic "1" and "0" at its output. Test data generation circuit 70 may change values at the rising clock edges of signal RCLK', because flip-flop 74 is a positive-edge-trigger flip-flop that is controlled by RCLK' (see, e.g., FIG. 6).

Register transfer circuit 66 may include first and second negative-edge-triggered flip-flops 84 that respectively receive the test data and delayed test data (e.g., a delayed version of the test data that is fed through delay circuit 82) from test data generation circuit 70. Flip-flops 84 may latch the respective test data at the falling clock edges of signal RCLK'.

An error detection circuit such as logic XOR gate 88 may receive signals from first and second flip-flops 84 and may generate error signal ERRH at its output. Signal ERRH is high if the signal values of the test data and the delayed test data are different at the falling clock edge (e.g., if the high clock phase is shorter than the delay of delay circuit 82). Signal ERRH is low if the signal values of the test data and the delayed test data are the same at the falling clock edge (e.g., if the high clock phase is greater than the delay of delay circuit 82).

Low clock phase register transfer circuit 68 may generate error signal ERRL at its output. Signal ERRL is low if the low clock phase (i.e., the duration of the low clock phase) is greater than the delay of delay circuit 82. Signal ERRL is high if the low clock phase is shorter than the delay of delay circuit 82.

Circuit 68 may include test data generation circuit 72. Test data generation may include flip-flop 78 and inverter 80. Flip-flop 78 may have an output that is fed back to its input through inverter 80. Test data generation circuit 72 may use this feedback configuration to generate a test data stream that toggles back and forth between logic "1" and "0" at its output. Test data generation circuit 72 may change values at the falling clock edges of signal RCLK', because flip-flop 78 is a negative-edge-trigger flip-flop.

Register transfer circuit 68 may include first and second positive-edge-triggered flip-flops 86 that receive the test data and delayed test data (e.g., a delayed version of the test data that is fed through delay circuit 82) from test data generation circuit 72, respectively. Flip-flops 86 may latch the respective test data at the rising clock edges of signal RCLK'. Logic XOR gate 88 may receive signals from first and second flip-flops 86 and may generate error signal ERRL at its output. Signal ERRL is high if the signal values of the test data and the delayed test data are different at the rising clock edge (e.g., if the low clock phase is shorter than the delay of delay circuit 82). Signal ERRL is low if the signal values of the test data and the delayed test data are the same at the rising clock edge (e.g., if the low clock phase is greater than the delay of delay circuit 82).

Control circuitry 90 receives error signals ERRH and ERRL from register transfer circuits 66 and 68 and provides a control signal over line 30 to control clock buffer 14 (which may be considered to form part of adaptive DCD correction circuitry 26), as shown in FIG. 6. Based on the error signal values, control circuitry 90 can determine whether the delay provided by delay circuits 82 is too short (e.g., the delay is less than a half clock cycle) or whether the delay is too long (e.g., the delay is greater than a half clock cycle).

For example, when error signals ERRH and ERRL are both low simultaneously, it can be concluded that the high clock phase and the low clock phase are both greater than the delay of delay circuits 82. This can only occur if the delay of circuits 82 is less than a half clock cycle.

Consider another example in which error signals ERRH and ERRL are both high. This implies that the high clock phase and the low clock phase are both less than the delay of delay circuits 82. This can only occur if the delay of the delay circuits 82 is greater than a half clock cycle.

Control circuitry 90 may adjust the delay of delay circuits 82 by providing one or more control signals over line 92 in response to signals ERRH and ERRL. If circuitry 90 detects that the delay of circuit 82 is too short, circuitry 90 will control delay circuits 82 to increase the delay. If circuitry 90 detects that the delay of circuit 82 is too long, circuitry 90 will control delay circuits 82 to decrease the delay.

Figure 7:
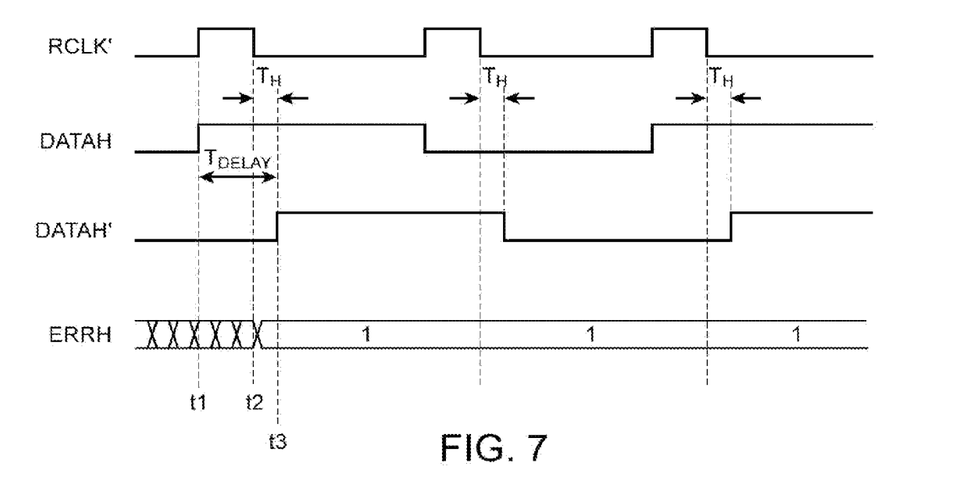
FIGS. 7 and 8 are timing diagrams that show the behavior of relevant signals in the adaptive duty cycle distortion correction circuitry of FIG. 6 when a given delay in the correction circuitry is too short in accordance with an embodiment of the present invention.
Figure 8:
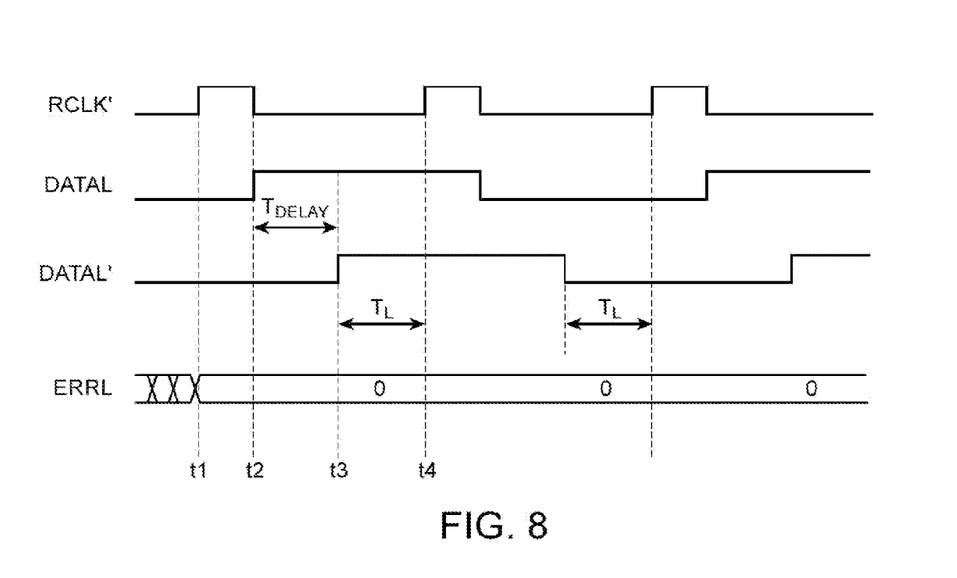

FIGS. 7 and 8 are timing diagrams that show the behavior of relevant signals during operation of register transfer circuits 66 and 68 when RCLK' is highly skewed such that the high phase is shorter than $T_{DELAY}$ (e.g., a delay provided by delay circuits 82) and the low phase is longer than $T_{DELAY}$.

FIG. 7 shows relevant signal waveforms in high clock phase register transfer circuit 66. At time t1, signal RCLK' is raised high and triggers test data generation circuit 70 (FIG. 6) to toggle test data DATAH (e.g., test data DATAH changes to a new value). At time t2, RCLK' falls low. At this point, test data DATAH and delayed test data DATAH' (e.g., the delayed version of test data DATAH that is delayed by delay circuit 82) may be compared. Delay $T_{DELAY}$ may have a duration that is approximately a third of the clock cycle (as an example).

In this scenario, error signal ERRH will be high, because data DATAH' is delayed by duration $T_{DELAY}$ that is longer than the high clock phase (i.e., the time period from t1 to t2). At time t3, delayed data DATAH' is raised high after $T_{DELAY}$. The time period from t2 to t3 as indicated by $T_H$ shows the amount of time that the high clock phase of signal RCLK' needs to be lengthened in order for ERRH to be low.

FIG. 8 shows relevant signal waveforms in low clock phase register transfer circuit 68. At time t1, signal RCLK' is raised high. At time t2, RCLK' falls low and triggers test data generation circuit 72 (FIG. 6) to toggle test data DATAL (e.g., test data DATAL changes to a new value). At time t3, delayed test data DATAL' (e.g., the delayed version of test data DATAL that is delayed by delay circuit 82) may be changed to the new value. The time period from t2 to t3 is equal to delay $T_{DELAY}$ (e.g., the same amount of delay as shown in FIG. 7).

At time t4, signal RCLK' is raised high. At this point, test data DATAL and delayed test data DATAL' may be compared. In this scenario, error signal ERRL will be low, because the low clock phase (i.e., the time period from t2 to t4) is longer than delay $T_{DELAY}$. The time difference from t3 to t4 as indicated by $T_L$ shows the amount of time that the low clock phase of signal RCLK' needs to be shortened in order for ERRL to be high.

Figure 9:
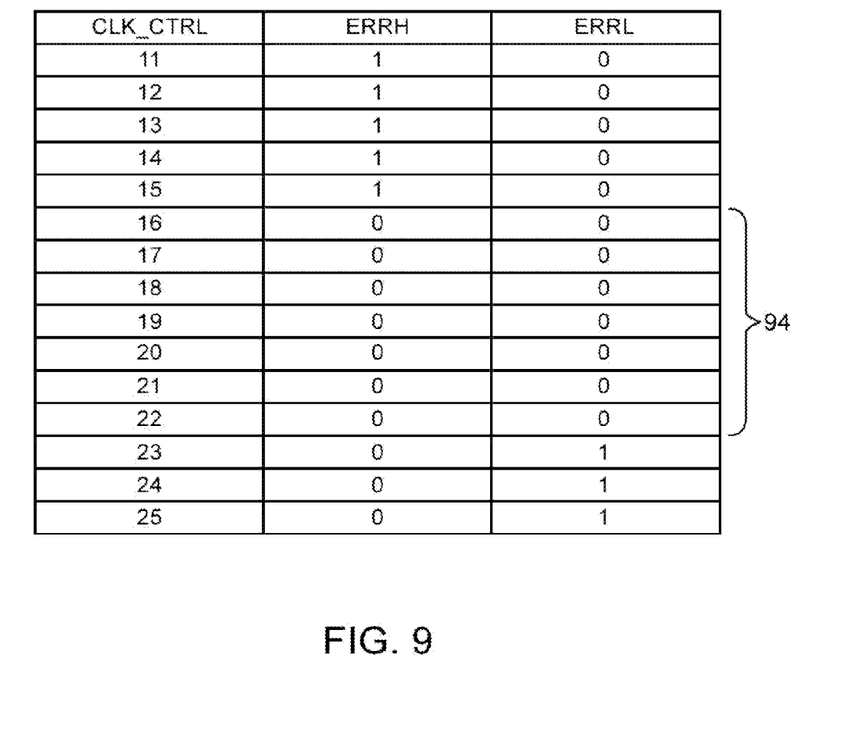
FIG. 9 is a table showing illustrative error signal values that may vary with clock control settings when a given delay in the correction circuitry of FIG. 6 is too short in accordance with an embodiment of the present invention.

The scenario illustrated in FIGS. 7 and 8 may correspond to the row with clock buffer control setting CLK_CTRL having a value of 11, as shown in the table of FIG. 9. Clock buffer control signal CLK_CTRL adjusts clock buffer 14 to generate a clock signal at the output of buffer 14 with different duty cycles. For example, CLK_CTRL with a low value (e.g., a value of 11) may correspond to RCLK' having a short high clock phase relative to its low clock phase (i.e., RCLK' will have a low duty cycle percentage). CLK_CTRL with a high value (e.g., a value of 25) may correspond to local signal RCLK' having a short low clock phase relative to its high clock phase (i.e., RCLK' will have a high duty cycle percentage). In general, as the value of signal CLK_CTRL increases, the high clock phase increases while the low clock phase decreases by the same amount.

For example, error signal ERRH is high when the value of signal CLK_CTRL increases from 11 to 15 (e.g., period $T_H$ of FIG. 7 gradually diminishes, because the high clock phase is increasing while $T_{DELAY}$ stays constant). Signal ERRH becomes low when the value of signal CLK_CTRL is greater than 15, because the high clock phase is greater than $T_{DELAY}$, which extends the time of test data comparison to times during which data DATAH and DATAH' are both equal.

Similarly, error signal ERRL is low when the value of signal CLK_CTRL increases from 11 to 22 (e.g., duration $T_L$ of FIG. 8 gradually diminishes, because the high clock phase is increasing while $T_{DELAY}$ stays constant). Signal ERRL becomes high when the value of signal CLK_CTRL is greater than 22, because the low clock phase is shorter than $T_{DELAY}$, which places the time of test data comparison to times during which data DATAL and DATAL' are unequal. The high clock phase should be increased by a greater amount before signal ERRL changes value, because the delay of circuit 82 is shorter than a half clock cycle.

In this example, error signals ERRH and ERRL may both be low when CLK_CTRL have values that range from 16 to 22, as indicated by gap 94 in FIG. 9. A gap such as gap 94 in which both error signals are "0" can only occur if the delay of the delay circuits 82 is less than a half clock cycle.

In general, it is difficult to configure delay circuits 82 of FIG. 6 to exactly match a half clock cycle, since there are a finite number of discrete delay settings, and none of them may perfectly match an arbitrary clock cycle. As a result, a small amount of mismatch is tolerable. For example, when the delay is approximately equal to a half clock cycle, there may be a small range of CLK_CTRL values where error signals ERRH and ERRL are both low (if the delay is slightly less than a half clock cycle) or are both high (if the delay is slightly greater than a half clock cycle). Once this situation arises, it may be desirable to operate adaptive DCD correction circuitry 26 at an optimum point that is approximately at the center of the range where both error signals are low or high. This optimum operating point produces a signal RCLK' that has well matched clock phases (e.g., the optimum point provides signal RCLK' with approximately 50% duty cycle).

Figure 10:
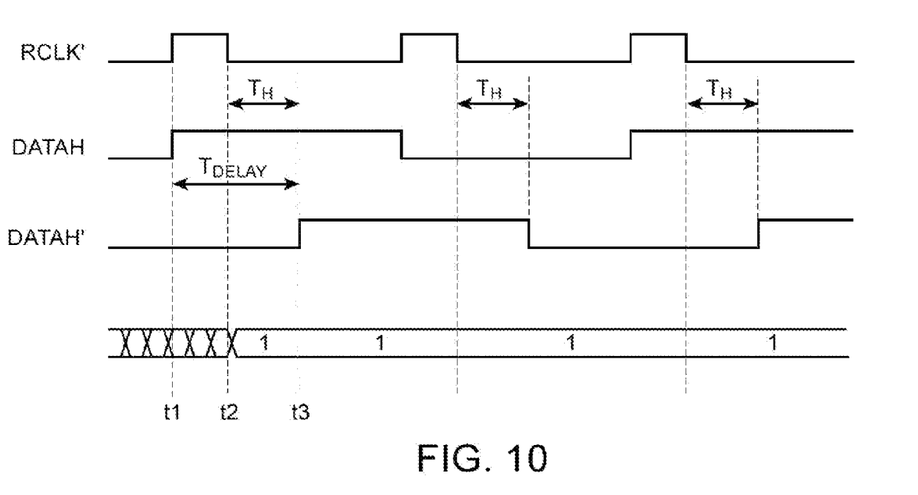
FIGS. 10 and 11 are timing diagrams that show the behavior of relevant signals in the adaptive duty cycle distortion correction circuitry of FIG. 6 when a given delay in the correction circuitry is too long in accordance with an embodiment of the present invention.
Figure 11:
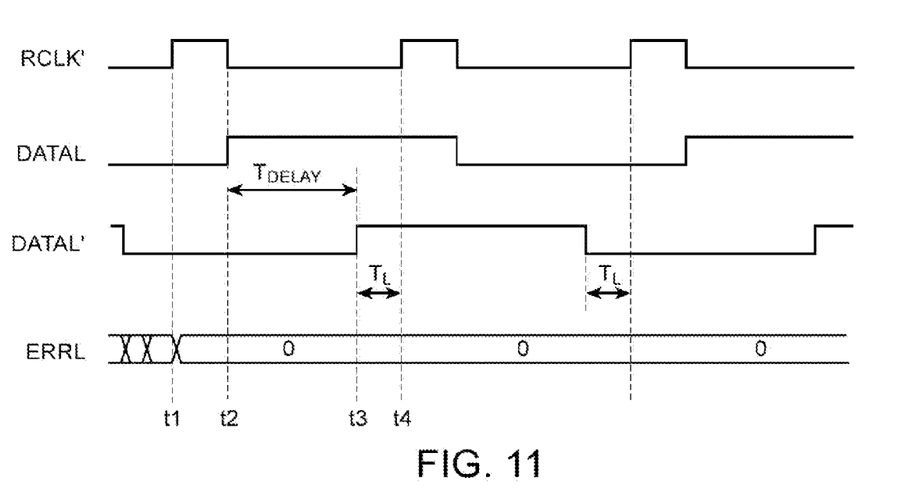

For example, consider a scenario in which the delay of delay circuits 82 is slightly greater than a half clock cycle. FIGS. 10 and 11 are timing diagrams that show the behavior of relevant signals during operation of register transfer circuits 66 and 68 when the delay of delay circuits 82 is slightly longer than a half clock cycle (e.g., the delay of circuits 82 may be 7/12 of a clock cycle).

FIG. 10 shows relevant signal waveforms in high clock phase register transfer circuit 66. At time t1, signal RCLK' is raised high and triggers test data generation circuit 70 (FIG. 6) to toggle test data DATAH. At time t2, RCLK' falls low. At this point, test data DATAH and delayed test data DATAH' are compared.

In this scenario, error signal ERRH will be high, because data DATAH' is delayed by duration $T_{DELAY}$ that is longer than the high clock phase (i.e., the time period from t1 to t2). At time t3, delayed data DATAH' is raised high after $T_{DELAY}$.

Delay $T_{DELAY}$ may have a duration that is approximately 7/12 of a clock cycle (as an example). The time period from t2 to t3 as indicated by $T_H$ shows the amount of time that the high clock phase of signal RCLK' needs to be lengthened in order for ERRH to be low.

FIG. 11 shows relevant signal waveforms in low clock phase register transfer circuit 68. At time t1, signal RCLK' is raised high. At time t2, RCLK' falls low and triggers test data generation circuit 72 (FIG. 6) to toggle test data DATAL to a new value. At time t3, delayed test data DATAL' (e.g., the delayed version of test data DATAL that is delayed by $T_{DELAY}$) may be changed to the new value.

At time t4, signal RCLK' is raised high. At this point, test data DATAL and delayed test data DATAL' may be compared. In this scenario, error signal ERRL will be low, because the low clock phase (i.e., the time period from t2 to t4) is longer than delay $T_{DELAY}$. The time difference $T_L$ from t3 to t4 corresponds to the amount of time that the low clock phase of signal RCLK' needs to be shortened in order for ERRH to be high.

Figure 12:
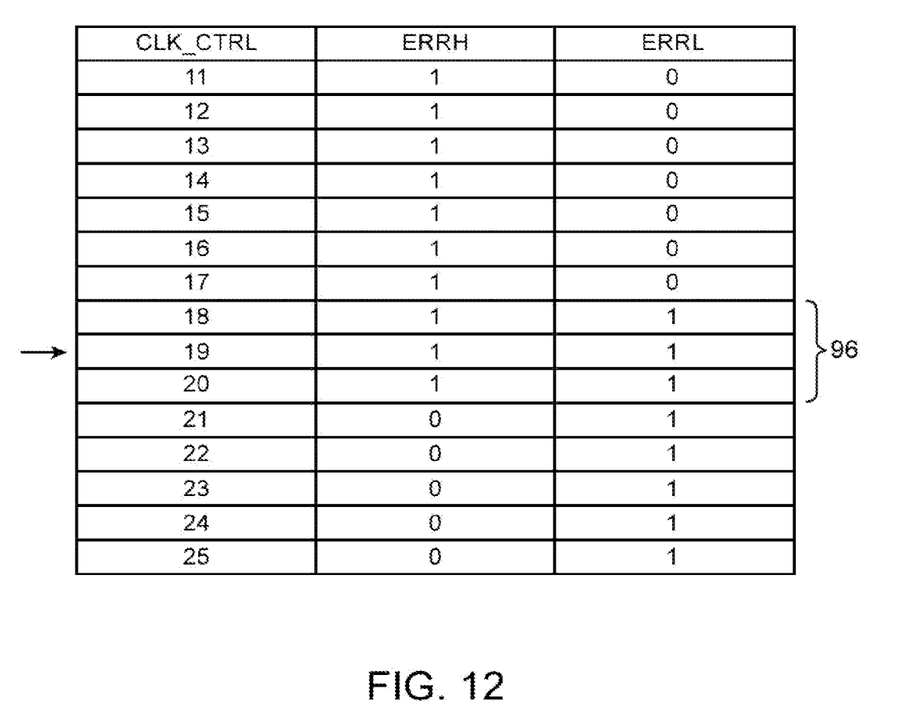
FIG. 12 is a table showing illustrative error signal values that may vary with clock control settings when a given delay in the correction circuitry of FIG. 6 is too long in accordance with an embodiment of the present invention.

The scenario as illustrated in FIGS. 10 and 11 may correspond to the row in which clock buffer control signal CLK_CTRL has a value of 11, as shown in the table of FIG. 12.

Error signal ERRH may be high when the value of signal CLK_CTRL increases from 11 to 20 (e.g., $T_H$ of FIG. 7 gradually diminishes, because the high clock phase is increasing while $T_{DELAY}$ stays constant). Signal ERRH becomes low when the value of signal CLK_CTRL is greater than 20, because the high clock phase is greater than $T_{DELAY}$, which extends the time of test data comparison to times during which data DATAH and DATAH' are both equal.

Similarly, error signal ERRL may be low when the value of signal CLK_CTRL increases from 11 to 17 (e.g., $T_L$ of FIG. 8 gradually diminishes, because the high clock phase is increasing while $T_{DELAY}$ stays constant). Signal ERRL becomes high when the value of CLK_CTRL is greater than 17, because the low clock phase is shorter than $T_{DELAY}$, which places the time of test data comparison to times during which data DATAH and DATAH' are unequal. The high clock phase should be increased by a greater amount before signal ERRH changes value (see, e.g., FIGS. 10 and 11, $T_H$ is slightly longer than $T_L$), because the delay of circuit 82 is slightly greater than a half clock cycle.

In this example, error signals ERRH and ERRL may both be high when CLK_CTRL have values that range from 18 to 20, as indicated by small overlapping range 96 in FIG. 12. An overlap such as overlap 96 in which both error signals are "1" can only occur if the delay of the delay circuits 82 is greater than a half clock cycle.

It may be desirable to operate adaptive DCD correction circuitry 26 to provide settings CLK_CTRL on control line 30 with a value that corresponds to the midpoint of this small overlapping range 96. For example, a signal CLK_CTRL with a value of 19 may configure clock buffer 14 to provide signal RCLK' with minimal duty cycle distortion.

Control circuitry 90 may dynamically adjust the delay of delay circuits 82 continuously during operation of correction circuitry 26. For example, whenever control circuitry 90 determines that the delay of circuits 82 is slightly greater than a half clock cycle, control circuitry 90 may shorten the delay of circuits 82 by a small amount. Doing so may result in a small gap where CLK_CTRL values are both low. The optimum operating point will similarly correspond to the midpoint of this small gap region and may provide signal RCLK' with minimal duty cycle distortion.

Adaptive DCD correction circuitry 26 adjusts the duty cycle of local signal RCLK' by adjusting the pull-up and pull-down drive strengths of clock buffer 14. For example, by decreasing the pull-up drive strength of buffer 14, the rise time of signal CLK is decreased, which effectively shortens the high clock phase and lengthens the low clock phase. The pull-down drive strength of buffer 14 may likewise be decreased and effectively lengthens the high clock phase and shortens the low clock phase.

Figure 13:
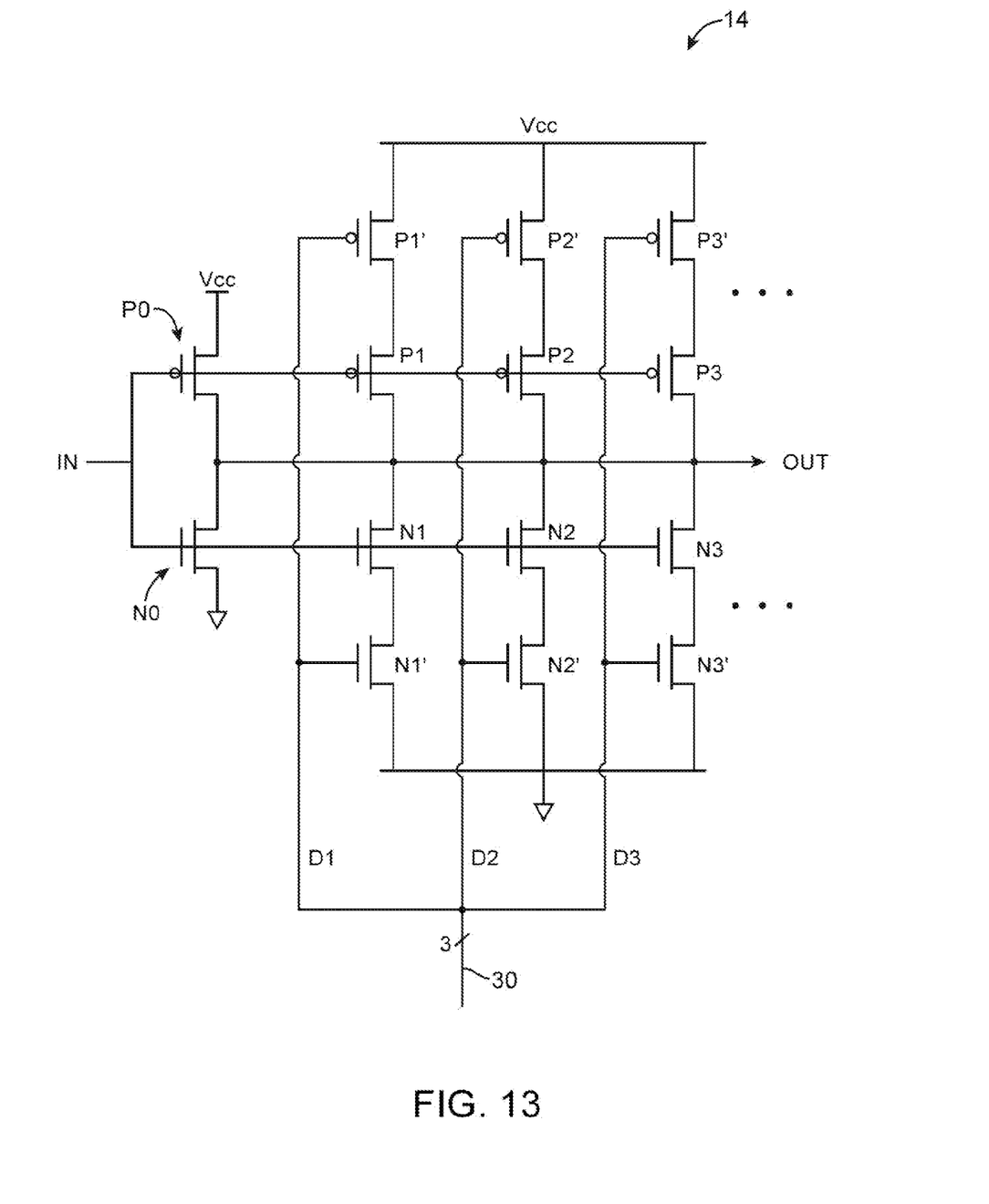
FIG. 13 is a circuit diagram of an illustrative clock buffer that may be controlled by the adaptive duty cycle distortion correction circuitry of FIG. 6 in accordance with an embodiment of the present invention.

An illustrative circuit implementation of clock buffer 14 is shown in FIG. 13. Buffer 14 may, for example, include an inverter followed by first, second, and third inverter-like circuits. The inverter has p-channel transistor P0 and n-channel transistor N0 coupled between the positive power supply line and the ground line. Transistors N0 and P0 may have gates that are connected to an input IN of clock buffer 14 and may have drain terminals that are connected to an output OUT of buffer 14.

Each inverter-like circuit may have first and second series-connected p-channel transistors coupled between the positive power supply line and OUT and may have first and second series-connected n-channel transistors coupled between OUT and the ground line. For example, the first inverter-like circuit has p-channel transistors P1 and P1' coupled between the power supply line and OUT and has n-channel transistors N1 and N1' coupled between OUT and the ground line. The second inverter-like circuit has p-channel transistors P2 and P2' coupled between the power supply line and OUT and has n-channel transistors N2 and N2' coupled between OUT and the ground line. The third inverter-like circuit has p-channel transistors P3 and P3' coupled between the power supply line and OUT and has n-channel transistors N3 and N3' coupled between OUT and the ground line.

Transistors P1, P2, P3, N1, N2, and N3 may have gates that are connected to input IN. Transistors P1' and N1' of the first inverter-like circuit may have gates controlled by data bit D1. Transistors P2' and N2' of the second inverter-like circuit may have gates controlled by data bit D2. Transistors P3' and N3' of the third inverter-like circuit may have gates controlled by data bit D3.

Data bits D1, D2, and D3 represent control data provided from control circuitry 90 over line 30. The control data bits may be used to configure the pull-up and pull-down drive strengths of clock buffer 14. For example, if the three data bits are set to "111," then the pull-down drive strength of buffer 14 will be increased (e.g., all the n-channel transistors in the pull-down path will be enabled) to shorten the high clock phase and lengthen the low clock phase (to decrease the duty cycle). If the three data bits are set to "000," then the pull-up drive strength of buffer 14 will be increased (e.g., all the p-channel transistors in the pull-up path will be enabled) to lengthen the high clock phase relative to the low clock phase (to increase the duty cycle).

Clock buffer 14 of FIG. 13 is merely illustrative. Any number of inverter-like circuits may be formed to provide any desired amount of pull-up/pull-down drive strength configurability. In other variations the control signal or signals may be analog voltages instead of digital logic values.

The circuit of FIG. 6 detects and error when either a rising or falling edge of DATAL or DATAH exceeds the delay. Since the delay of a circuit may differ for rising and falling edges, ERRL and ERRH might produce alternating 0 and 1 values for sequential cycles. To avoid the need to closely match rising and falling delays through delay circuits 82, it is possible to arrange that only one edge is used, for example only the rising edge. This can be accomplished by substituting an inverter and an AND gate for circuits 88. Alternatively, control circuitry 90 can be arranged such that it operates correctly in the presence of unequal rise fall delays, for example by ORing together consecutive clock cycle values of signals ERRL and ERRH, or by only sampling signals ERRL and ERRH when corresponding signals DATAL or DATAH are some particular value (e.g., a "0" or "1").

Figure 14:
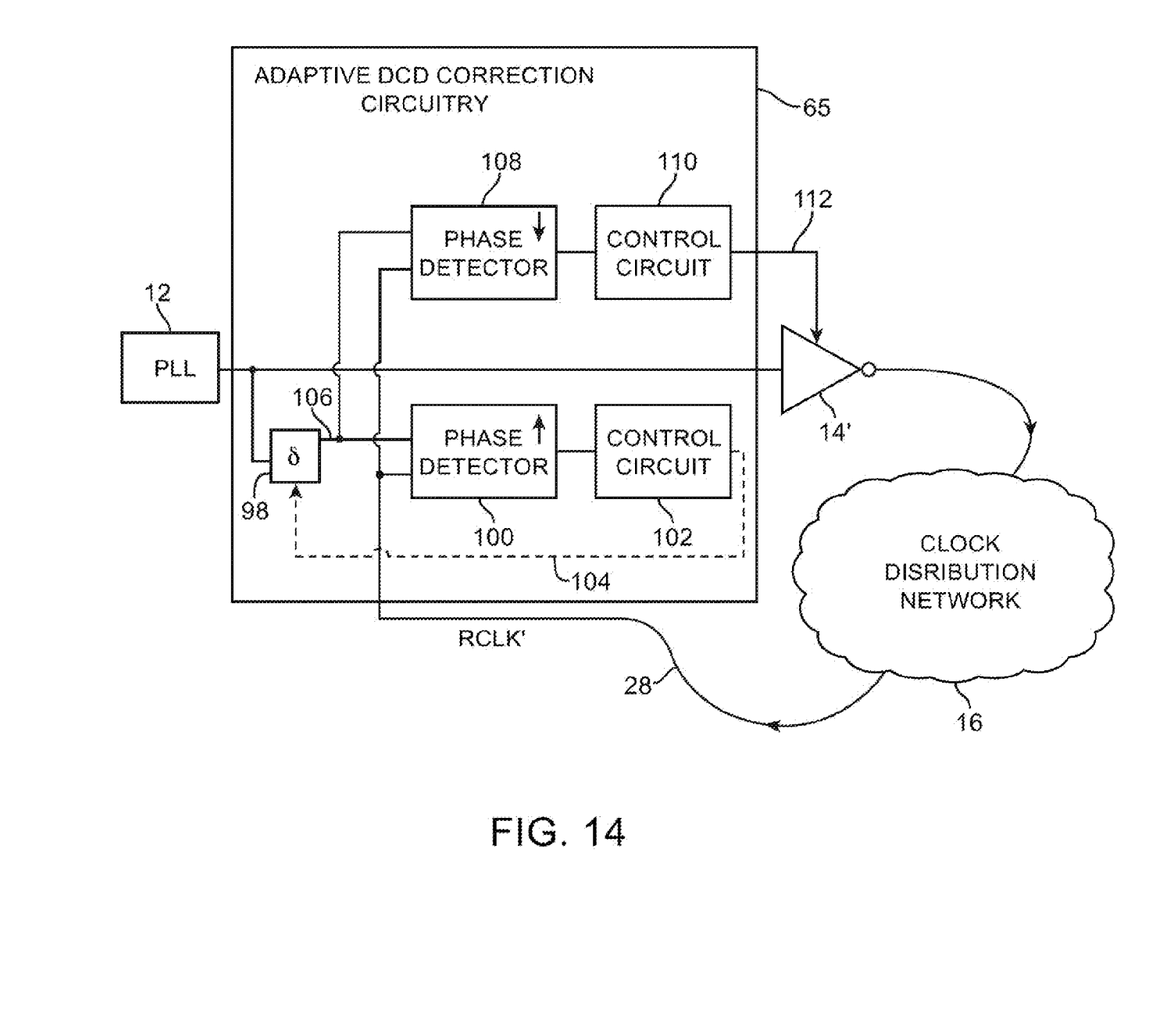
FIG. 14 is a diagram of illustrative duty cycle distortion correction circuitry that is connected to an output of a phase-locked loop in accordance with an embodiment of the present invention.

Another suitable arrangement for adaptive DCD correction circuitry is shown in FIG. 14. As shown in FIG. 14, DCD correction circuitry 65 may be connected to the output of PLL 12. Circuitry 65 may include a delay circuit such as delay circuit 98 that receives an original clock signal directly from PLL 12. Delay circuit 98 may output a delayed version of the clock signal generated by PLL 12 on line 106.

A first phase detector such as rising-edge (positive-edge) phase detector 100 may have a first input that receives the delayed clock signal over line 106 and may have a second input that receives signal RCLK' over line 28. Rising-edge phase detector 100 may compare the rising edge of the two clock signals at its inputs and output a result that controls circuit 102 based on this comparison. For example, if the rising edge of the delayed clock signal on line 106 comes before the rising edge of RCLK', then phase detector 100 may output a "0" to control circuit 102 (as an example). If the rising edge of the delayed clock signal on line 106 comes after the rising edge of RCLK', then phase detector 100 might output a "1" to control circuit 102.

Control circuit 102 may be used to adjust the delay of circuit 98 such that the delayed clock signal provided on line 106 is phase-locked with RCLK'. In other words, phase detector 100 and control circuit 102 connected in this feedback (loop) configuration may adjust the delay of circuit 98 so that the rising clock edges of the delayed signal on line 106 and RCLK' are aligned (matched). Control block 102 may adjust delay circuit 98 to provide a delay that is approximately equal to the signal propagation delay through the clock distribution network. Delay circuit 98, phase detector 100, and control circuit 102 may sometimes be referred to as forming a delay-locked loop (DLL).

Adaptive DCD correction circuitry 65 may further include a second phase detector such as falling-edge (negative-edge) phase detector 108 connected to control circuit 110. Falling-edge phase detector 108 may have a first input that receives the delayed clock signal over line 106 and may have a second input that receives signal RCLK' over line 28. The rising edge of these two clock signals are already aligned by phase detector 100 and control circuit 102. Phase detector 108 may compare the falling edge of the two clock signals at its inputs and output a corresponding result to control circuit 110 based on the comparison. For example, if the falling edge of the delayed clock signal on line 106 comes before the falling edge of RCLK', then phase detector 108 might output a "0" to control circuit 110 (as an example). If the falling edge of the delayed clock signal on line 106 comes after the falling edge of RCLK', then phase detector 108 might output a "1" to control circuit 110.

The delayed clock signal on line 106 is a clock signal with the same duty cycle as the output of PLL 12, because it is generated near the output of PLL 12 (e.g., the delayed clock signal on line 106 is relatively undistorted by noise and other coupling mechanisms), and delay 98 is designed to have closely matched rising and falling delays. Control circuit 110 may therefore provide control signals on line 112 to control clock buffer 14' that is connected to the output of PLL 12. In particular, control circuit 110 may dynamically adjust the pull-down drive strength of buffer 14' to shift the falling edge of signal RCLK' so that the falling edge of RCLK' is aligned with the falling edge of the delayed clock signal on line 106.

Aligning both the rising edge and the falling edge of signal RCLK' and the delayed clock signal on line 106 results in a situation in which signal RCLK' exhibits minimal duty cycle distortion, because the delayed clock signal on line 106 has the same duty cycle as the PLL output (e.g., adaptively adjusting clock buffer 14' in this way effectively locks the high clock phase to a half clock cycle).

The foregoing is merely illustrative of the principles of this invention and various modifications can be made by those skilled in the art without departing from the scope and spirit of the invention.

What is claimed is:

1. An integrated circuit, comprising:
    a clock distribution network operable to receive a clock signal and to provide a plurality of corresponding local clock signals;
    a plurality of clock pulse generators, wherein each clock pulse generator in the plurality of clock pulse generators is operable to receive a respective one of the local clock signals and to produce corresponding clock pulses;
    duty cycle distortion correction circuitry operable to adjust the clock signal that is provided to the clock distribution network; and
    a feedback path, wherein the duty cycle distortion correction circuitry is operable to receive the plurality of local clock signals over the feedback path.

2. The integrated circuit defined in claim 1, wherein the duty cycle distortion correction circuitry comprises circuitry operable to adjust the clock signal so that the local clock signals exhibit fifty percent duty cycle.

3. The integrated circuit defined in claim 1, wherein the duty cycle distortion correction circuitry includes a clock buffer having an output, wherein the clock buffer is operable to provide the clock signal to the clock distribution network at its output, and wherein the duty cycle distortion correction circuitry is operable to adjust the clock buffer so that the local clock signals exhibit fifty percent duty cycle.

4. The integrated circuit defined in claim 1, wherein the duty cycle distortion correction circuitry comprises:
    a first register transfer circuit having a first delay circuit;
    a second register transfer circuit having a second delay circuit; and
    control circuitry that is coupled to the first and second register transfer circuits, wherein the control circuitry is operable to adjust the first and second delay circuits and wherein the control circuitry is operable to generate the clock signal that is provided to the clock distribution network.

5. An integrated circuit, comprising:
    a clock distribution network operable to receive a clock signal and to provide a plurality of corresponding local clock signals;
    a plurality of clock pulse generators, wherein each clock pulse generator in the plurality of clock pulse generators is operable to receive a respective one of the local clock signals and to produce corresponding clock pulses;
    duty cycle distortion correction circuitry operable to adjust the clock signal that is provided to the clock distribution network; and
    a phase-locked loop operable to supply a clock input to the duty cycle distortion correction circuitry, wherein the duty cycle distortion correction circuitry is operable to adjust the clock input to produce the clock signal that is provided to the clock distribution network.

6. The integrated circuit defined in claim 5, wherein the clock input supplied by the phase-locked loop has a given duty cycle and wherein the duty cycle distortion correction circuitry comprises circuitry operable to adjust the clock signal so that the local clock signals exhibit duty cycles that are equal to the given duty cycle.

7. An integrated circuit, comprising:
a clock distribution network operable to receive a clock signal and to provide a plurality of corresponding local clock signals;
a plurality of clock pulse generators, wherein each clock pulse generator in the plurality of clock pulse generators is operable to receive a respective one of the local clock signals and to produce corresponding clock pulses;
duty cycle distortion correction circuitry operable to adjust the clock signal that is provided to the clock distribution network; and
an input-output pin operable to supply a clock input to the duty cycle distortion correction circuitry, wherein the duty cycle distortion correction circuitry is operable to adjust the clock input to produce the clock signal that is provided to the clock distribution network.

8. The integrated circuit defined in claim 7, wherein the clock input supplied by the input-output pin has a given duty cycle and wherein the duty cycle distortion correction circuitry comprises circuitry operable to adjust the clock signal so that the local clock signals exhibit duty cycles that are equal to the given duty cycle.

9. An integrated circuit, comprising:
a clock distribution network operable to receive a clock signal and to provide a plurality of corresponding local clock signals;
a plurality of clock pulse generators, wherein each clock pulse generator in the plurality of clock pulse generators is operable to receive a respective one of the local clock signals and to produce corresponding clock pulses;
duty cycle distortion correction circuitry operable to adjust the clock signal that is provided to the clock distribution network; and
a plurality of level-sensitive pulse latches operable to receive the clock pulses generated by the plurality of clock pulse generators.

10. An integrated circuit, comprising:
a plurality of pulse latches each of which has a clock pulse input;
a clock distribution network that distributes a plurality of local clock signals; and
a plurality of dual-edge clock pulse generators each of which receives a respective one of the local clock signals and produces corresponding clock pulses in response to both rising and falling edges of the local clock signals, wherein the clock pulse inputs of the plurality of pulse latches receive the clock pulses.

11. The integrated circuit defined in claim 10, wherein each of the plurality of dual-edge clock pulse generators includes a delay circuit that generates multiple delayed versions of the local clock signal that is received by that dual-edge clock pulse generator.

12. The integrated circuit defined in claim 11, wherein each of the plurality of dual-edge clock pulse generators further comprises a multiplexer that is connected to the delay circuit.

13. The integrated circuit defined in claim 12, wherein each of the plurality of dual-edge clock pulse generators further comprises:

a first logic gate that has a first input that receives a first control signal, a second input that receives a first delayed clock signal from the multiplexer, a third input that receives the local clock signal, and an output; and
a second logic gate that has a first input that receives a second control signal, a second input that receives a second delayed clock signal from the multiplexer, a third input that receives the local clock signal, and an output.

14. The integrated circuit defined in claim 13, wherein each of the plurality of dual-edge clock pulse generators further comprises:
a first transmission gate; and
a second transmission gate, wherein the third input of the first logic gate receives the local clock signal through the first transmission gate and wherein the second input of the second logic circuit receives the second delayed clock signal through the second transmission gate.

15. The integrated circuit defined in claim 13, wherein each of the plurality of dual-edge clock pulse generators further comprises:
a third logic gate that has a first input that is connected to the output of the first logic gate, a second input that is connected to the output of the second logic gate, and an output that is connected to the clock pulse input of a corresponding one of the plurality of pulse latches.

16. The integrated circuit defined in claim 12, further comprising an adjustable clock buffer that provides a clock signal to the clock distribution network.

17. The integrated circuit defined in claim 16, further comprising control circuitry that receives one of the local clock signals as a feedback signal and that adjusts the clock buffer to correct for duty cycle distortion in the local clock signals.

18. An integrated circuit, comprising:
a clock distribution network that receives an input signal and that provides a plurality of corresponding clock signals;
a plurality of dual-edge clock pulse generators each of which receives a respective one of the clock signals and produces a corresponding output signal exhibiting clock pulses in response to both rising and falling edges of the local clock signals; and
duty cycle distortion correction circuitry that adjusts the input signal that is provided to the clock distribution network, wherein the duty cycle distortion correction circuitry includes a delay-locked loop.

19. The integrated circuit defined in claim 18, wherein the delay-locked loop comprises a delay circuit that receives the input signal and that produces a delayed clock that is a delayed version of the input signal.

20. The integrated circuit defined in claim 19, wherein the delay-locked loop includes a first phase detector and a first control circuit and wherein the first control circuit adjusts the delay circuit so that rising edges of the delayed clock and rising edges of a respective one of the clock signals are aligned.

21. The integrated circuit defined in claim 20, wherein the duty cycle distortion correction circuit further comprises a clock buffer, a second phase detector, and a second control circuit, wherein the second control circuit adjusts the clock buffer so that falling edges of the delayed clock and falling edges of the respective one of the clock signals are aligned.

* * * * *